United States Patent
Staudinger et al.

(10) Patent No.: US 11,522,498 B2
(45) Date of Patent: Dec. 6, 2022

(54) RF POWER AMPLIFIER WITH EXTENDED LOAD MODULATION

(71) Applicant: NXP USA, Inc., Austin, TX (US)

(72) Inventors: Joseph Staudinger, Gilbert, AZ (US); Matthew Russell Greene, Crystal Lake, IL (US); Edward Provo Wallis Horne, Burlington (CA); Johannes Lambertus Holt, Calgary (CA); Peter Zahariev Rashev, Calgary (CA)

(73) Assignee: NXP USA, Inc., Austin, TX (US)

( * ) Notice: Subject to any disclaimer, the term of this patent is extended or adjusted under 35 U.S.C. 154(b) by 142 days.

(21) Appl. No.: 16/951,781

(22) Filed: Nov. 18, 2020

(65) Prior Publication Data

US 2022/0158590 A1 May 19, 2022

(51) Int. Cl.
*H03F 1/02* (2006.01)
*H03F 3/195* (2006.01)
*H03F 1/56* (2006.01)
*H03F 3/60* (2006.01)
*H03F 3/24* (2006.01)

(52) U.S. Cl.
CPC ............ *H03F 1/0288* (2013.01); *H03F 1/56* (2013.01); *H03F 3/195* (2013.01); *H03F 3/245* (2013.01); *H03F 3/604* (2013.01); *H03F 2200/451* (2013.01)

(58) Field of Classification Search
CPC ....................................................... H03F 1/0288
See application file for complete search history.

(56) References Cited

U.S. PATENT DOCUMENTS

| | | | |
|---|---|---|---|
| 2,210,028 A | 8/1940 | Doherty | |
| 7,248,108 B2 | 7/2007 | Fratti | |
| 8,576,010 B2 | 11/2013 | Yanduru et al. | |
| 10,862,434 B1 * | 12/2020 | McLaren | H03K 5/01 |
| 2005/0130608 A1 * | 6/2005 | Forse | H03F 3/191 |
| | | | 455/120 |
| 2007/0194853 A1 * | 8/2007 | Mori | H03F 1/0261 |
| | | | 330/302 |
| 2009/0174496 A1 * | 7/2009 | Van Bezooijen | H03F 3/191 |
| | | | 333/17.3 |
| 2012/0092074 A1 * | 4/2012 | Yanduru | H03F 1/0288 |
| | | | 330/295 |
| 2016/0105153 A1 * | 4/2016 | Chen | H03F 1/0205 |
| | | | 330/296 |

* cited by examiner

*Primary Examiner* — Patricia T Nguyen

(57) ABSTRACT

Aspects of the subject disclosure may include a Doherty amplifier that includes a carrier amplifier having an output terminal, an output network coupled to the output terminal, and a peaking amplifier, wherein the output network comprises a non-linear reactance component, and wherein the non-linear reactance component changes an effective impedance of a load presented to the carrier amplifier when the peaking amplifier is off. Other embodiments are disclosed.

20 Claims, 12 Drawing Sheets

510

1210

1220

RF POWER AMPLIFIER WITH EXTENDED LOAD MODULATION

TECHNICAL FIELD

Embodiments of the subject matter described herein relate generally to radio frequency (RF) power amplifiers, and more particularly to Doherty power amplifiers.

BACKGROUND

A typical Doherty power amplifier (PA) includes a signal splitter to receive and divide an input RF signal, a carrier amplifier (also known as a "main" amplifier) to amplify a first signal from the splitter, a peaking amplifier (also known as an "auxiliary" amplifier) to amplify a second signal from the splitter, a signal combiner to combine the amplified signals from the carrier and peaking amplifiers, and various impedance transformation and phase delay elements to ensure that the amplified signals are combined in phase, and that desirable impedances are present at various points within the Doherty PA. The signal splitter and signal combiner are commonly implemented on a printed circuit board (PCB) substrate, and the carrier and peaking amplifiers are implemented using one or more discretely packaged devices that are physically coupled to the PCB substrate.

In modern wireless 4G and 5G communication systems, the design of RF power amplifiers becomes more complicated. Some of these systems require the PA to operate at very low power output back-off (e.g., 8 to 12 decibels (dB)) for good linearity, while limiting signal compression associated with high peak-to-average power ratio signals and achieving high power added efficiency. Doherty PA and inverted Doherty PA configurations remain popular in wireless base stations. However, high levels of integration are desired to meet the stringent requirements of modern wireless standards, including providing wide instantaneous bandwidths and high efficiency.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
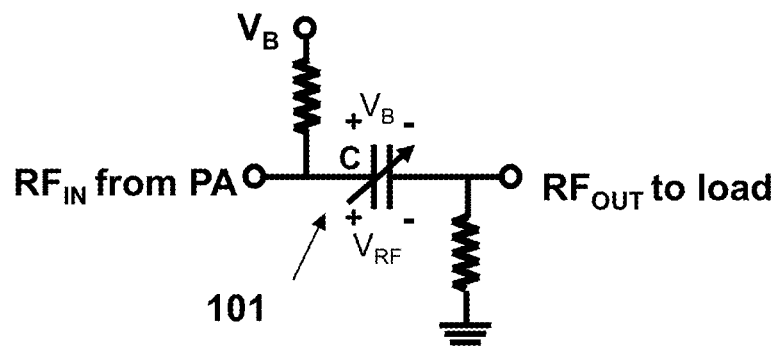
FIG. 1 is a schematic circuit diagram that illustrates an example of a non-linearity of a passively tunable integrated circuit (PTIC) in relation to the RF signal and bias condition.

A system and method to implement load modulation in RF power amplifiers is disclosed. This method can be applied broadly to many types of PAs to load modulate the PA or to further extend any existing load modulation, thereby realizing improved efficiency. This method can be applied to amplifiers operated in class A/B/C/F modes, which are not typically load modulated, and transform them into more efficient amplifiers through load modulation using this method. In particular, the system realizes load modulation in such amplifiers, but may be implemented in Doherty RF power amplifiers as well to extend the range of load modulation and improve the efficiency of said Doherty amplifiers. In an embodiment, the system and method utilize a reactance having a non-linear operating characteristic, placed in an output matching network of a carrier amplifier in such a manner/configuration, to enable load modulation of the carrier amplifier at signal levels where the peaking amplifier is not conducting, thereby extending load modulation of the carrier amplifier, which further results in improved performance (primarily efficiency) of the carrier amplifier. Other embodiments are contemplated by the subject disclosure.

Aspects of the present disclosure include an amplifier that has an input terminal and an output terminal. An input network can be coupled to the input terminal of the amplifier and an output network coupled to the output terminal of the amplifier. A non-linear reactance component can be further coupled to the output network. A change in an output voltage signal generated by the amplifier causes the non-linear reactance component to change an effective impedance of a load presented to the amplifier via the output network. The non-linear reactance component can be configured to utilize a fixed bias voltage that serves as an operating reference point of the non-linear reactance component. The non-linear reactance component can include a plurality of reactance elements arranged in series. A number of the plurality of reactance elements can be selected to produce a non-linear impedance profile that operates within a range of the output voltage signal generated by the amplifier and the operating reference point of the non-linear reactance component.

Aspects of the present disclosure further include a Doherty amplifier that includes a carrier amplifier coupled to a first output network, the first output network including a non-linear reactance component configured to utilize a fixed bias voltage that serves as an operating reference point of the non-linear reactance component. A peaking amplifier can be coupled to a second output network that is also coupled to the first output network resulting in a combined network configurable for coupling to a load. A change in an output voltage signal generated by the carrier amplifier causes the non-linear reactance component to change an effective impedance of the load presented to the carrier amplifier via the combined network. The non-linear reactance component can include a plurality of reactance elements arranged in series. A number of the plurality of reactance elements can be selected to produce a non-linear impedance profile that operates within a range of the output voltage signal generated by the carrier amplifier and the operating reference point of the non-linear reactance component.

Aspects of the present disclosure further include a method of applying a first bias voltage to a carrier amplifier of a Doherty power amplifier to operate the carrier amplifier in a first mode, applying a second bias voltage to a peaking amplifier of the Doherty power amplifier to operate the peaking amplifier in a second mode, thereby improving active load modulation of the carrier amplifier at a first input power level greater than a turn-on point of the peaking amplifier, and applying a third fixed bias voltage to a non-linear reactance component coupled to the carrier amplifier, the peaking amplifier, or both. The third fixed bias voltage can serve as an operating reference point of the non-linear reactance component. A number of the plurality of reactance elements can be selected to produce a non-linear impedance profile that operates within an operating range of the Doherty power amplifier and the operating reference point of the non-linear reactance component. The non-linear reactance component extends a range of load modulation of the Doherty power amplifier.

Generally speaking, the principle of dynamic load modulation is defined as a change in the effective impedance of a load presented to a PA, which can be based on the operating voltage of the PA. For example, if the RF input voltage to the RF PA is decreased, and hence the RF output voltage decreases, the RF output network changes the effective impedance of the load, due to a non-linear characteristic of one or more components in the RF output network. If the effective load impedance presented to the PA is increased as the RF voltage decreases, a higher efficiency can be achieved by the amplifier at lower output power levels.

FIG. 1 is a schematic circuit diagram that illustrates an example of a non-linear characteristic of a passively tunable integrated circuit in relation to the RF signal and a bias condition. An output network 100 includes one or more non-linear reactance component(s) 101, illustrated as a variable capacitor C, with a first terminal coupled through an RF input ($RF_{IN}$) to a PA, and a second terminal coupled through an RF output ($RF_{OUT}$) to a load. Non-linear reactance component 101 includes, but is not limited to, a passively tunable integrated circuit (PTIC), a varactor diode, a metal-oxide semiconductor (MOS) capacitor or a variable plate micro-electro-mechanical system (MEMS) capacitor. Other devices may be used, so long as the component exhibits a passive non-linear reactance that is continuously variable.

Figure 2:
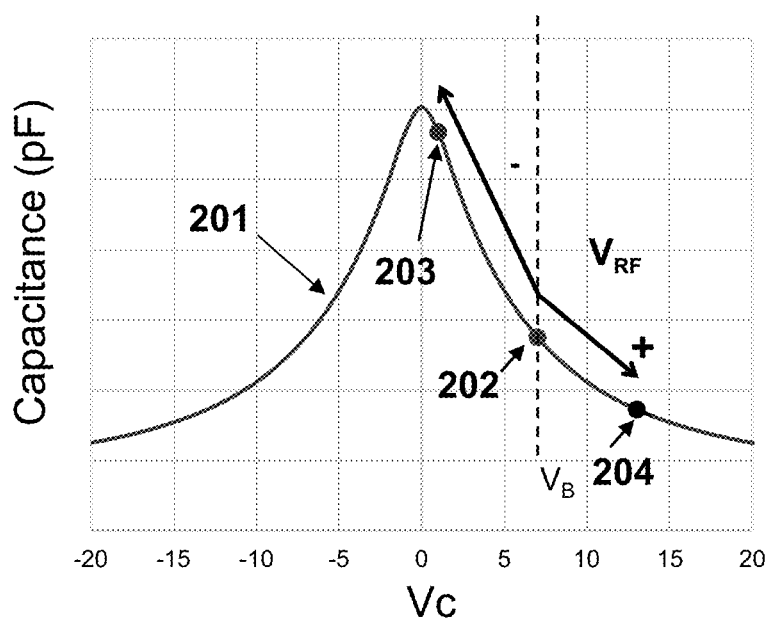
FIG. 2 is a graph that illustrates an example of a non-linearity of a passively tunable integrated circuit illustrated in FIG. 1 in relation to the RF signal and bias condition.

FIG. 2 is a graph that illustrates an example of a non-linear characteristic of the passively tunable integrated circuit illustrated in FIG. 1 in relation to the RF signal and bias condition. As shown in FIG. 2, the capacitance of non-linear reactance component 101 is inherently nonlinear as seen in the capacitance-voltage (C-V) curve 201 shown. The operating point of non-linear reactance component 101 depends upon a DC bias voltage $V_B$ applied across the component. As shown in the graph 200, the capacitance of non-linear reactance component 101 has a particular value indicated by the dotted line running through the dot 202 on C-V curve 201 when biased with the DC bias voltage $V_B$. The net voltage $V_C$ seen by the non-linear reactance component 101 is the sum of the DC bias voltage $V_B$ and the instantaneous RF voltage $V_{RF}$. The capacitance value of non-linear reactance component 101 varies non-linearly with respect to the RF voltage $V_{RF}$ provided by the PA. As $V_{RF}$ voltage decreases to point 203, the capacitance of non-linear reactance component 101 increases, and hence, the reactance decreases, thereby decreasing the effective impedance of the load. Conversely, as $V_{RF}$ voltage increases to point 204, the capacitance of non-linear reactance component 101 decreases, and hence, the reactance increases, thereby increasing the effective impedance of the load. In an embodiment, the DC bias voltage $V_B$ applied across the non-linear reactance component is fixed, and could be zero or non-zero, as explained further below.

Figure 3:
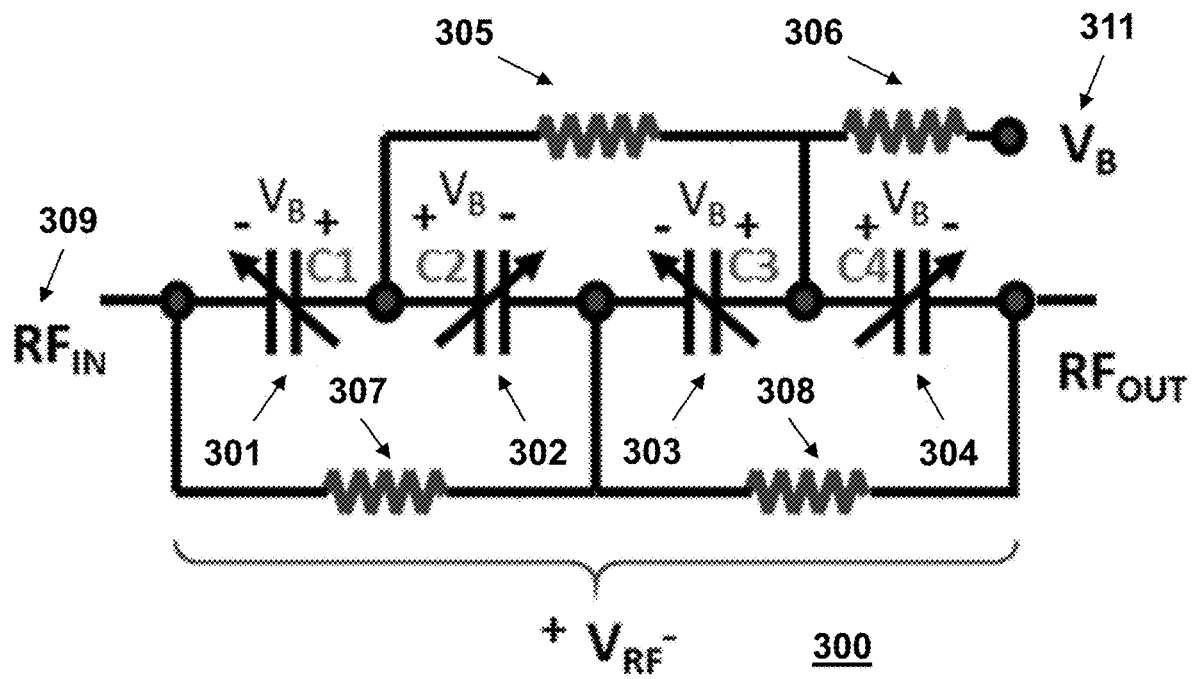
FIG. 3 is a schematic circuit diagram illustrating the nonlinear behavior of a plurality of non-linear reactance elements, also known as a "stack," in an output network of a PA.

FIG. 3 is a schematic circuit diagram illustrating the nonlinear behavior of a plurality of non-linear reactance elements, also referred to as a "stack," in an output network of a PA. The stack 300 is arranged as a series of non-linear reactance elements 301, 302, 303, 304 (C1-C4) that modulate the load impedance of a PA as a function of an RF envelope signal ($V_{RF}$). A DC bias voltage ($V_B$) is applied to the stack 300 of non-linear reactance elements 301, 302, 303, 304 through resistors 305, 306, 307, 308, the polarity $V_B$ applied to each non-linear reactance element is illustrated in the circuit diagram. An RF voltage ($V_{RF}$) is impressed across the stack 300. Because the plurality of non-linear reactance elements 301, 302, 303, 304 are arranged in series, they act as a voltage divider, effectively providing a quarter of the RF voltage across each non-linear reactance element, as illustrated in the graph of FIG. 4.

When amplifying a modulated signal via a PA with a high peak-to-average power ratio, the load impedance beneficially changes as a function of power in sync with the RF envelope signal ($V_{RF}$). A PA output network can be designed utilizing the non-linear reactance elements 301, 302, 303, 304 such that when the power generated by the PA increases, the increase in RF voltage across each non-linear reactance element will reduce an aggregate capacitance in the non-linear reactance elements 301, 302, 303 and 304 (C1-C4), which is beneficial for high power operation of the PA. Conversely, when the power generated by the PA output network is reduced, the reduction in RF voltage across the non-linear reactance element will increase the aggregate capacitance in non-linear reactance elements 301, 302, 303 and 304 (C1-C4), which is beneficial for lower power operation of the PA. To achieve sufficient load modulation, the number of the non-linear reactance elements 301, 302, 303 and 304 (i.e., the stack 300) has to be small enough to provide a range of RF voltage swing on each of the individual non-linear reactance elements of the stack 300 to take advantage of the non-linear characteristics of each of the individual non-linear reactance elements of the stack 300. Depending on the range of RF voltage swing generated by the PA, a number of non-linear reactance elements in the stack 300 can range from 1-12 non-linear reactance elements. However, for a voltage range of approximately +/−5 volts as shown in FIG. 4, four or fewer non-linear reactance elements in the stack 300 is preferred.

Figure 4:
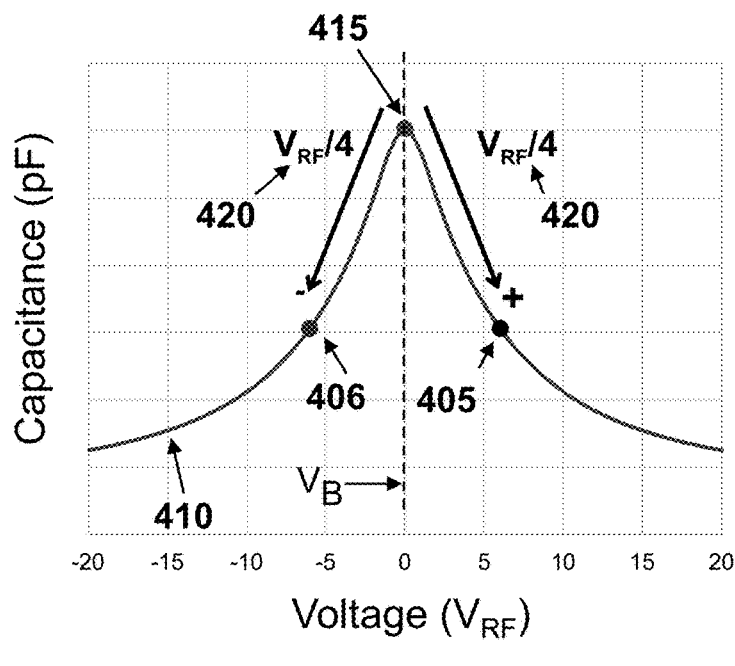
FIG. 4 is a graph illustrating the nonlinear behavior of a plurality of non-linear reactance elements.

An embodiment of the subject disclosure intentionally reduces the number of non-linear reactance elements to capitalize on the non-linear effect provided by the stack 300, thereby providing load modulation, as illustrated in FIGS. 2 and 4. This design feature is contrary to a conventional design objective where stacks with a large number of non-linear reactance elements are used to divide the RF voltage to small incremental voltage ranges to help eliminate the non-linear effect of the non-linear reactance elements. In an embodiment, the non-linear reactance elements of the stack 300 can be biased at 0V DC. This is known as self-bias. The 0V DC self-bias is exemplary. However, a designer may choose a different fixed bias voltage that is non-zero as an operating point of the stack 300.

FIG. 4 is a graph illustrating the nonlinear behavior of a plurality of non-linear reactance elements. Graph 400 illustrates the change in capacitance of reactance elements 301-304 (i.e., stack 300) as a function of an input RF voltage ($V_{RF}$) 309 and bias point ($V_B$) 311. Depending on where the bias point ($V_B$) 311 is configured, the input RF voltage ($V_{RF}$) 309 can modulate the capacitance of a pair of reactance elements (301/302, or 303/304) in a manner that is inversely proportional between elements of the pair of reactance elements. For example, if the bias point ($V_B$) 311 is set to reference point 405 illustrated on one side of the curve 410 (or point 406 on the other side of the curve 410), the capacitance of one of the elements in each pair will increase, while the capacitance of the other element of each pair will decrease, thereby resulting in only a small net change in capacitance of the stack 300. However, when the bias point ($V_B$) 311 is located at reference point 415, having a fixed bias voltage at zero volts, the capacitance of the stack 300 will change from a peak capacitance at reference point 415 to a lower capacitance when the input RF voltage ($V_{RF}$) 309 swings above or below the bias point ($V_B$) 311, thereby increasing the non-linear effect of the stack 300 as compared to when the bias point ($V_B$) 311 is configured at reference points 405 or 406. Stated differently, when the bias point ($V_B$) 311 is located at reference point 415, the capacitance of each non-linear reactance element in pairs 301/302 and 303/304 are modulated by the input RF voltage ($V_{RF}$) 309 constructively (i.e., direct proportional change in capacitance between reactance elements in each pair), as opposed to destructively (i.e., inverse proportional change in capacitance between reactance elements in each pair).

Figure 5A:
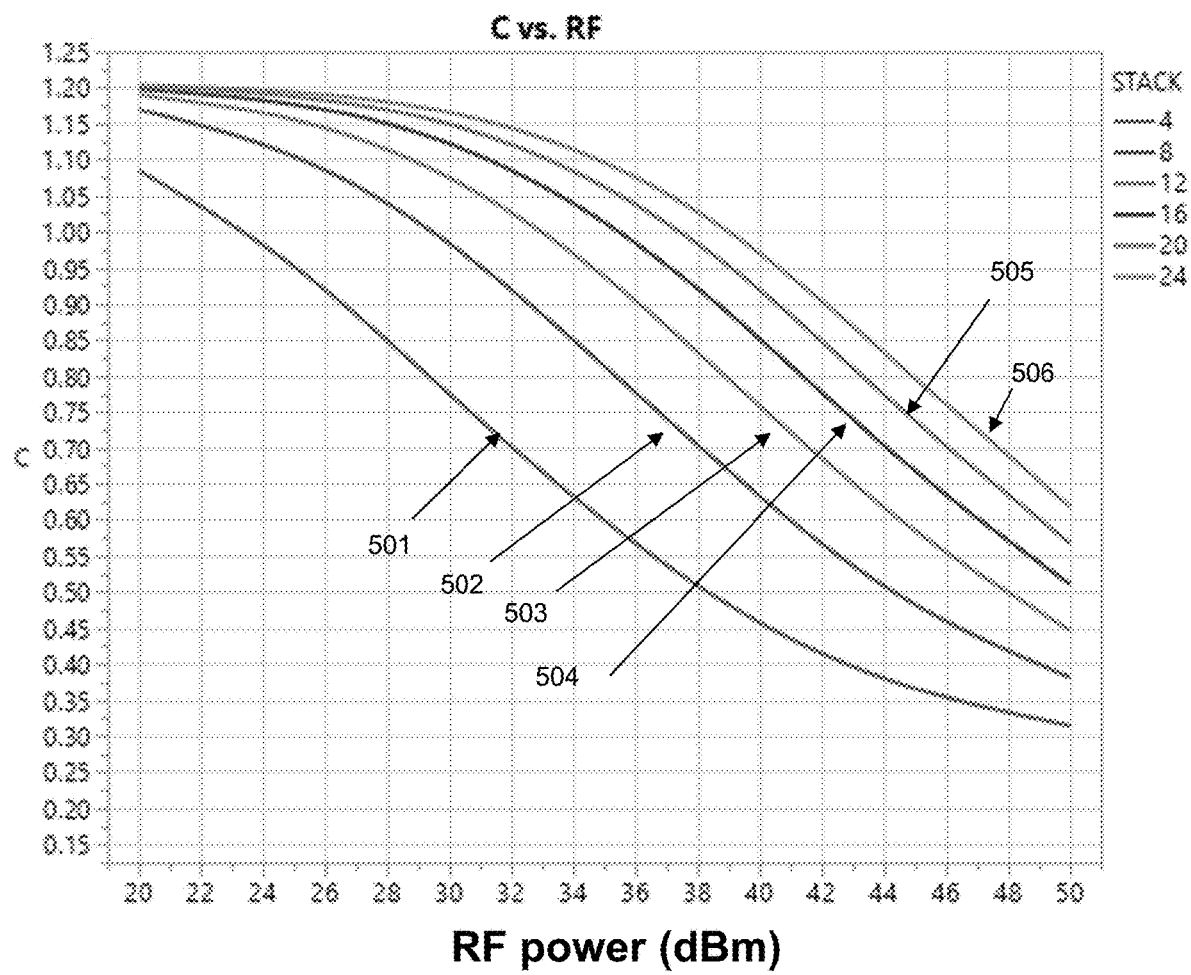
FIG. 5A is a graph illustrating the effective capacitance of different stacks of self-biased PTICs versus the RF power level of the PA.

FIG. 5A is a graph illustrating the effective capacitance of different stacks of self-biased PTICs versus the RF power level applied to the stack. Graph 500 illustrates a curve 501 for a stack having 4 non-linear reactance elements, curve 502 for a stack having 8 non-linear reactance elements, curve 503 for a stack having 12 non-linear reactance elements, curve 504 for a stack having 16 non-linear reactance elements, curve 505 for a stack having 20 non-linear reactance elements, and curve 506 for a stack having 24 non-linear reactance elements. The mean capacitance of each PTIC stack is plotted against RF power (in dBm) applied to the stack. As illustrated by FIG. 5A, at low power levels, the effective capacitance of a PTIC is large, and at higher power levels, the effective capacitance is small. The number of PTICs in a stack are sized to scale with RF swing voltage.

In certain applications, such as PTICs utilized in a variable impedance matching network, nonlinear characteristics in PTICs are not desirable for impedance matching applications. To mitigate nonlinear effects, a large stack of capacitors can be connected in series to divide the RF voltage, such that each individual capacitor will have a small RF voltage across the non-linear capacitor, thereby minimizing the non-linear effect of each capacitor and the stack as a whole. Typical stack values for matching network applications can range from 16 to 48 variable capacitors configured in series. By eliminating the non-linear effect of the tunable capacitor, the capacitance of the stack can be controlled primarily by controlling the bias voltage applied in a matching network application. Applications that require linearity are in stark contrast to the load modulation embodiment of the subject disclosure as illustrated by FIGS. 1-4. In the subject disclosure, a designer can limit a size of a stack of non-linear reactance elements so as to increase the non-linear characteristics of the stack about a fixed bias voltage, which can then be modulated by an RF input voltage received by the stack. As noted above, the subject disclosure differs from conventional use which intentionally focuses on increasing linearity of a stack of non-linear reactance elements by choosing a stack such as curve 506 (or higher—not shown) and varying the bias voltage applied to the stack to achieve a desired capacitance. In the subject disclosure, a smaller stack is preferred (e.g., curve 501) with a fixed bias voltage (e.g., 0V) whereby the input RF voltage modulates the impedance of the stack as illustrated in FIG. 4.

Figure 5B:
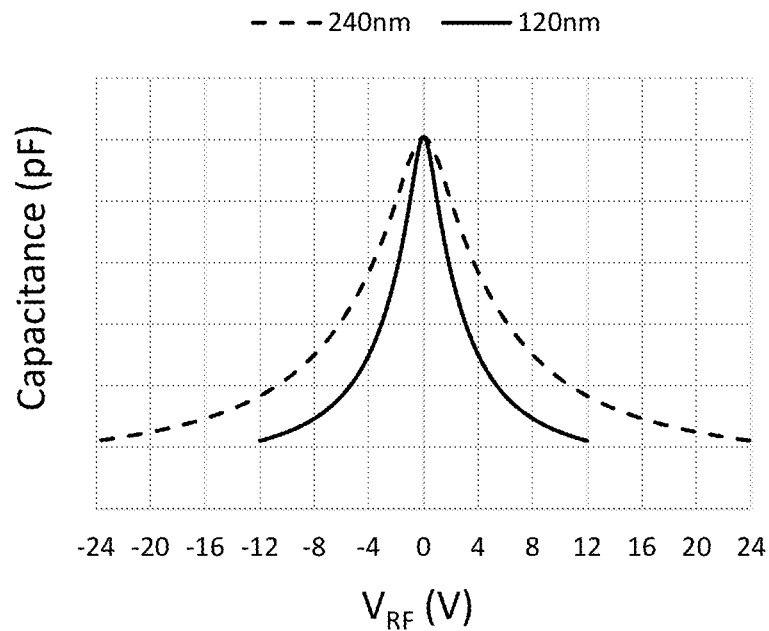
FIG. 5B is a graph illustrating effective tuning response for two different dielectric thicknesses of a non-linear reactance element versus the RF voltage level of the PA.

FIG. 5B is a graph 510 illustrating a tuning response of two different dielectric thicknesses (i.e., 120 nanometers (nm) and 240 nm, respectively) of a non-linear reactance element (e.g., two different dielectric film thicknesses between plates of a capacitor) based on an RF voltage level applied to the non-linear reactance element. In the illustration of FIG. 5B, a designer can choose a film thickness of a reactive element to align with a desired range of load modulation. A target capacitance range (at a fixed bias voltage) can be achieved by choosing a particular thickness of a tunable barium strontium titanate (BST) dielectric layer of a PTIC. In the illustration of FIG. 5B, the 120 nm film at half thickness can achieve approximately the same capacitance variation at half the voltage ($V_{RF}$) of the 240 nm film. Both films have the same response with respect to the applied electric field. This allows a designer to fabricate a reactance element having a thickness of the BST layer based on a range RF voltage levels expected in a specific application. Slight adjustments to the thickness of the BST layer can provide a designer more flexibility to make finer adjustments to the capacitance vs voltage profile of a stack than by changing the number of capacitors in the stack. In yet another embodiment, the capacitance versus voltage profile of a stack can be adjusted by modifying the BST material composition itself, such as by changing the barium to strontium (Ba/Sr) ratio or by adding other dopants to the BST layer. During the manufacturing of the capacitors in a stack, the deposition and annealing steps can also be adjusted to further alter the capacitance versus voltage profile of the stack. It will be appreciated that varying the number of capacitors in a stack, adjusting a thickness of the BST layer, adjusting the BST material composition, adjusting the deposition and annealing steps, or any combinations thereof, can be controllable parameters that can be used to achieve a desired capacitance versus voltage profile of a capacitor, and thus the capacitance versus voltage profile of a stack.

Figure 6:
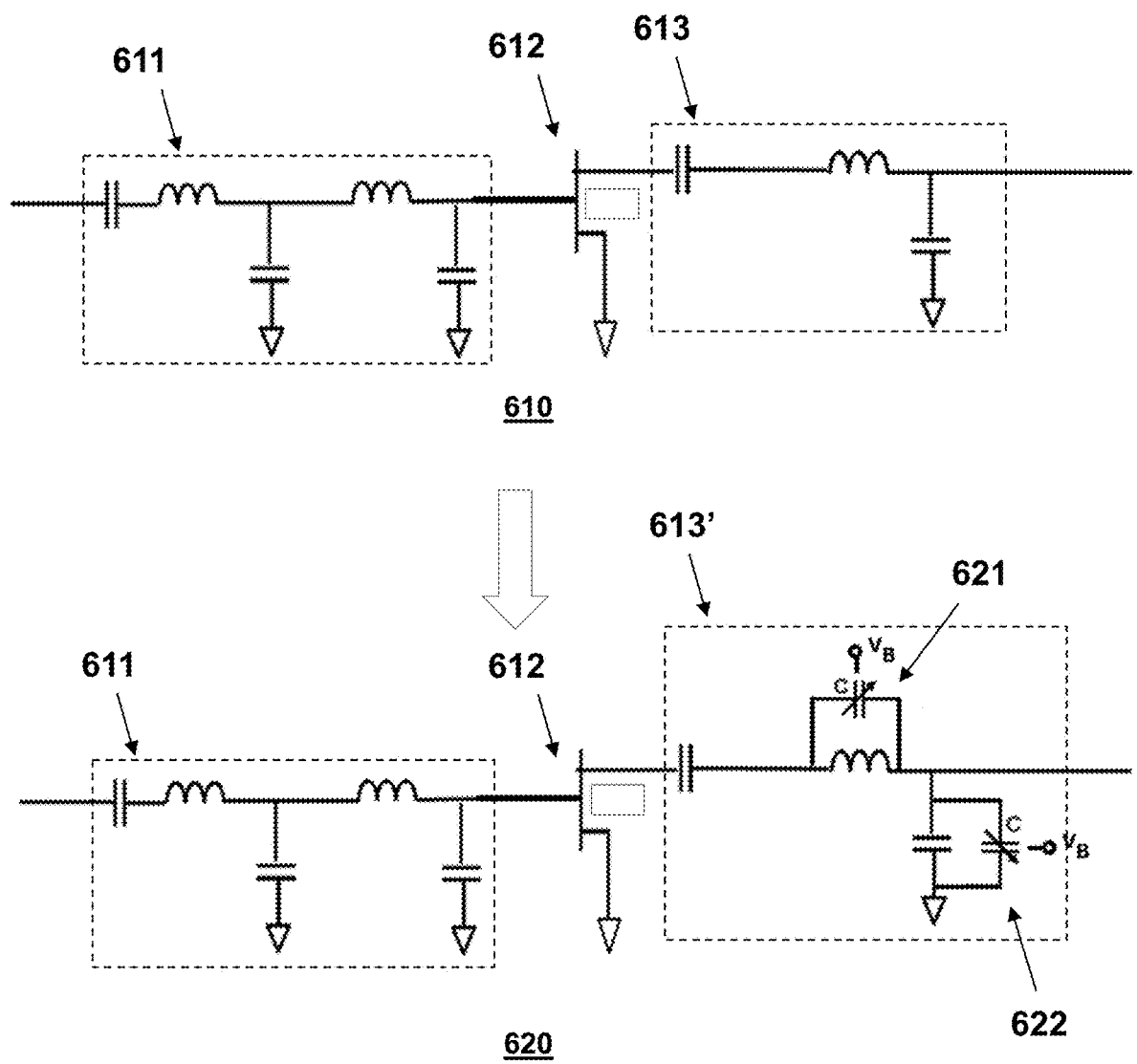
FIG. 6 includes two schematic diagrams illustrating an amplifier circuit without load modulation elements, and an amplifier circuit illustrating the placement of parallel and/or shunt non-linear reactance components to improve the power efficiency of the amplifier with load modulation.

FIG. 6 includes two schematic diagrams illustrating an amplifier circuit 610 without load modulation elements, and an amplifier circuit 620 illustrating the placement of parallel and/or shunt non-linear reactance components 621, 622 (e.g., each corresponding to stack 300, FIG. 3 or variations thereof). The parallel and/or shunt non-linear reactance components 621, 622 improve the power efficiency of the amplifier circuit 620 utilizing the load modulation feature provided by the non-linear reactance components 621, 622. As shown in FIG. 6, the amplifier circuit 610 comprises an input network 611 (e.g., an input impedance transformation circuit) coupled to a gate terminal of a transistor 612, and an output network 613 (e.g., an output impedance transformation network) coupled to a drain terminal of the transistor 612. Amplifier circuit 620 also comprises an input network 611 coupled to the gate terminal of transistor 612, and a modified output network 613' coupled to the drain terminal of transistor 612. The modified output network 613' differs from output network 613 in that it further comprises a first non-linear reactance component 621 that is arranged in parallel with a series inductor in the output network 613', and a second non-linear reactance component 622 that is arranged in parallel with a shunt capacitor in the output network 613'. As mentioned above, a fixed bias voltage $V_B$ can be applied to the non-linear reactance components 621, 622 to establish an operating point. The fixed bias can be ground or another preferable operating point in the capacitance to voltage profile shown by way of illustration in FIG. 4. A distinguishable difference between the subject disclosure and conventional systems is that the bias voltage $V_B$ is fixed and not controlled, and the RF voltage applied to the non-linear reactance components 621, 622 modulates the capacitance of these components.

It should be further appreciated that the placement of the first and second non-linear reactance components 621, 622 illustrated in FIG. 6 is non-limiting. For example, the non-linear reactance components 621, 622 can be placed in series (or parallel) with other components of the output network, the input network, or in another matching network (not illustrated). For instance, a similar arrangement of the first and second non-linear reactance components 621, 622 can be used with (e.g., placed in parallel with) the inductor and capacitor of the input networks 611 that are connected to the gate terminal of the transistor 612. In still other embodiments, the first and second non-linear reactance components 621, 622 may be placed in series with inductors and/or capacitors of the input and output networks 611, 613'. Accordingly, instances of the first and second non-linear reactance components 621, 622 can be used for input load modulation and/or output load modulation when such components are utilized in parallel (or in series) with inductors and/or capacitors of the input network 611 and/or the modified output network 613'.

Figure 7:
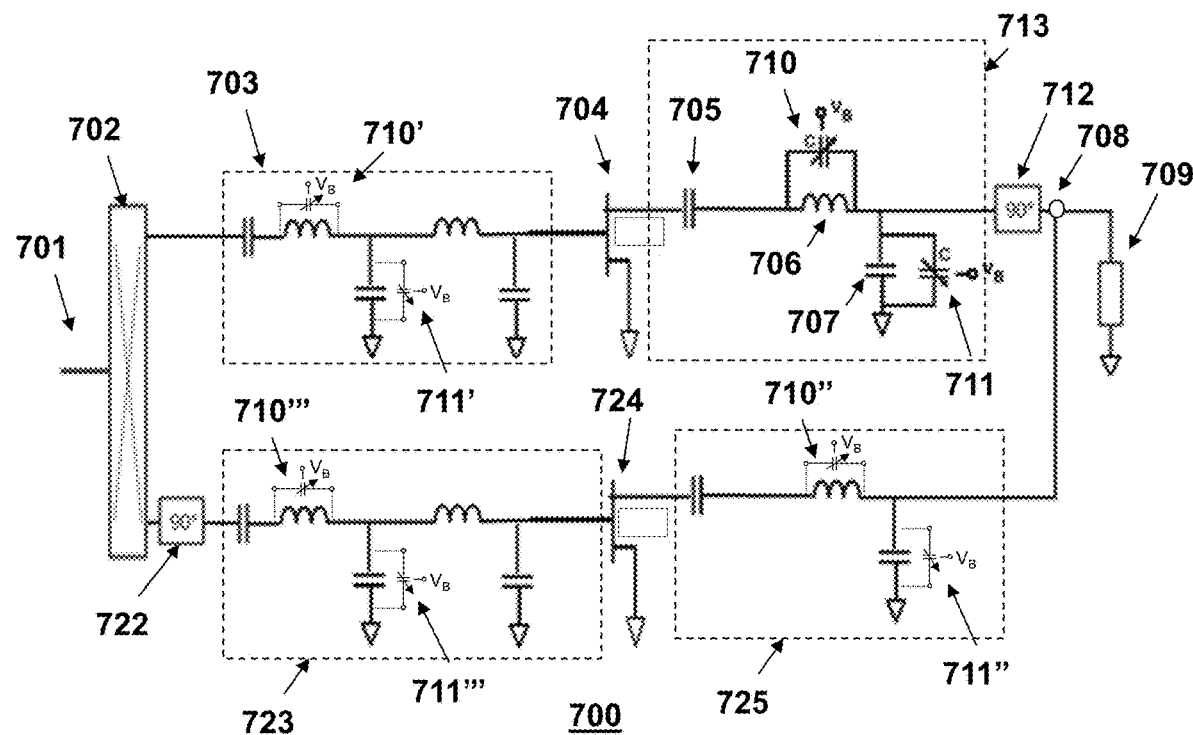
FIG. 7 is a schematic circuit diagram illustrating a modification to the carrier amplifier of a Doherty PA to extend the load modulation of the carrier PA.

FIG. 7 is a schematic circuit diagram illustrating a modification to the carrier amplifier of a Doherty PA 700 to provide load modulation to the carrier PA. The Doherty PA 700 of FIG. 7 is configured as a "two-way" Doherty power amplifier, which includes one carrier amplifier transistor 704 and one peaking amplifier transistor 724. Although not shown, the carrier amplifier transistor 704 and the peaking amplifier transistor 724 can each include combinations of an input matching network and pre-amplifier configured in series that is connected to an inter-stage matching network of the carrier amplifier transistor 704 and the peaking amplifier transistor 724, respectively. Reference below to a gate terminal of the carrier amplifier transistor 704 and the peaking amplifier transistor 724, respectively, can be considered illustrative when such components are integrated into the carrier amplifier transistor 704 and the peaking amplifier transistor 724. The carrier amplifier transistor 704 provides amplification along a carrier amplification path, and the peaking amplifier transistor 724 provides amplification along a peaking amplification path. As shown in FIG. 7, the Doherty PA 700 comprises a signal splitter 702 coupled to an input terminal 701, and a carrier amplifier path having an input network 703 coupled to an output of the signal splitter 702 and a gate terminal of carrier amplifier transistor 704, and an output network 713 coupled to a drain terminal of the carrier amplifier transistor 704 and through an impedance transformer 712 to a combining node 708. The Doherty PA 700 further comprises a peaking amplifier path having an input network 723 coupled to a phase-shifter 722 at an output of the signal splitter 702 and a gate terminal of the peaking amplifier transistor 724, and an output network 725 coupled to a drain terminal of the peaking amplifier transistor 724 and the combining node 708.

Signal splitter 702 is configured to divide the power of an input RF signal received at input terminal 701 into carrier and peaking portions of the input signal. During operation in a full-power mode when both the carrier and peaking amplifier are supplying current to a load 709, the signal splitter 702 divides the input signal power between the amplification paths. In an embodiment, the signal splitter 702 may divide the power equally. It is important that phase coherency between the carrier and peaking amplification paths is maintained across a frequency band of interest to ensure that the amplified carrier and peaking signals arrive in phase at the combining node 708, and thus to ensure proper Doherty amplifier operation.

In the embodiment illustrated in FIG. 7, the output network 713 of the carrier amplifier comprises a capacitor-inductor-capacitor (CLC) network comprising a series capacitor 705, a series inductor 706 and a shunt capacitor 707. The output network 713 further includes a series non-linear reactance component 710 (e.g., a first instance of stack 300, FIG. 3, or a modified version thereof) that is parallel to series inductor 706 and a shunt non-linear reactance component 711 (e.g., a second instance of stack 300, FIG. 3, or a modified version thereof) that is parallel to shunt capacitor 707. The non-linear reactance components 710, 711 can be configured to utilize a fixed bias voltage (e.g., 0 volts). In this configuration, the non-linear reactance components 710, 711 added to the output network 713 of the carrier amplifier path can provide load modulation based on the output voltage generated by the carrier amplifier transistor 704, as will be explained further below with respect to FIG. 8.

As noted above, the Doherty PA 700 also comprises a peaking amplifier path that includes a phase shifter 722 coupled to the signal splitter 702. In a non-inverted Doherty configuration, input phase delay for the peaking amplifier is achieved by phase shifter 722 coupled between signal splitter 702 and peaking amplifier input network 723. According to an embodiment, phase shifter 722 applies about 90 degrees of phase delay to the peaking input signal before the signal is provided to the peaking amplifier. In certain embodiments, phase shifter 722 may include a quarter wave transmission line, a lumped-element delay circuit, or another suitable type of delay element of about 90 degrees.

The output network 713 of the carrier amplifier and the output network 725 of the peaking amplifier are coupled to the combining node 708 through an impedance transformer 712. The impedance transformer compensates for the 90-degree phase delay difference between the carrier and peaking amplification paths introduced by phase shifter 722. Load 709 may be coupled to the combining node 708 to receive an amplified RF signal from Doherty PA 700.

The Doherty PA 700 of FIG. 7 can have alternate embodiments such as multiple amplifier peaking paths and/or an "inverted" load network configuration. In an inverted load configuration, the Doherty amplifier is configured so that an input signal supplied to the carrier amplifier is delayed by about 90 degrees with respect to the input signal(s) supplied to the peaking amplifier(s). To compensate for the phase difference between the carrier and peaking paths, an output phase delay of 90 degrees can be applied to the output signal(s) of the peaking amplifier(s) before reaching the combining node 708.

The carrier amplifier transistor 704 and the peaking amplifier transistor 724 can be configured to include a single power transistor or multiple cascaded power transistors for amplifying an RF signal supplied by the signal splitter 702 via input network 703. As used herein, the term "transistor" means a field effect transistor (FET) or another type of suitable transistor. For example, a "FET" may be a metal-oxide-semiconductor FET (MOSFET), a laterally diffused MOSFET (LDMOS FET), an enhancement-mode or depletion-mode high electron mobility transistor (HEMT), or another type of FET. According to various embodiments, each of the power transistors in the carrier and peaking amplifier may be implemented, for example, using a silicon-based FET (e.g., an LDMOS FET), a silicon-germanium (SiGe) based FET, or a III-V FET (e.g., a HEMT), such as a gallium nitride (GaN) FET (or another type of III-V transistor, including a gallium arsenide (GaAs) FET, a gallium phosphide (GaP) FET, an indium phosphide (InP) FET, or an indium antimonide (InSb) FET).

Although the carrier and peaking amplifier transistors 704, 724 may be of equal size (e.g., in a symmetric Doherty configuration with a 1:1 carrier-to-peaking size ratio), the carrier and peaking amplifier transistors 704, 724 may have unequal sizes, as well (e.g., in various asymmetric Doherty configurations). In an asymmetric two-way Doherty amplifier configuration, the peaking amplifier transistor 724 typically is larger than the carrier amplifier transistor 704 by some multiplier. For example, the peaking amplifier transistor 724 may be twice the size of the carrier amplifier transistor 704 so that the peaking amplifier transistor 724 has twice the current carrying capability of the carrier amplifier transistor 704. Asymmetric carrier-to-peaking amplifier size ratios other than a 1:2 ratio may be implemented, as well. In such embodiments, the signal splitter 702 may divide the power unequally, and may match the asymmetric size ratio, particularly when the Doherty PA 700 has an asymmetric configuration other than a 1:1 carrier-to-peaking size ratio.

In an embodiment, the carrier amplifier transistor 704 and the peaking amplifier transistor 724 may include a single-stage amplifier. In yet other embodiments, the carrier amplifier transistor 704 and peaking amplifier transistor 724 may each have more than the two, cascade-coupled amplification stages. Input and inter-stage impedance matching networks may be implemented, respectively, at the input networks 703, 723 of each driver amplifier and between each driver amplifier and each final-stage amplifier (not shown). These components (as previously noted) may also be embedded in each of the carrier amplifier transistor 704 and the peaking amplifier transistor 724. In each case, the matching networks may incrementally increase the circuit impedance toward the load impedance. In addition to providing signal amplification of an input signal at the input terminal 701, each splitter branch of the signal splitter 702 may also provide a 50 ohm (or other) input impedance suitable for the input networks 703, 723 and output impedance matching characteristics that may eliminate in whole or in part a need for output matching networks of the carrier amplifier and the peaking amplifier, respectively.

The Doherty PA 700 may be "integrated," as that term is used herein, because at least the carrier amplifier, the peaking amplifier, and the combining node 708 are integrally and monolithically formed in one single IC die, which may be referred to herein as an "integrated Doherty amplifier die." In an alternate embodiment, the combining node 708 may be implemented separately from the IC die that includes the carrier amplifier and the peaking amplifier. According to an embodiment, all or portions of the input and inter-stage impedance matching networks also may be integrally and monolithically formed in the same IC die.

During operation of Doherty PA 700, the carrier amplifier transistor 704 can be biased to operate in class A, class B, or class AB modes, and the peaking amplifier transistor 724 typically can be biased to operate in class C mode. In some configurations, the peaking amplifier transistor 724 can alternatively be biased to operate in other modes. In an embodiment, the amplifier of each splitter branch may also be biased to operate according to the same mode or a suitable mode of operation in conjunction with the modes utilized by the carrier amplifier transistor 704 and the peaking amplifier transistor 724, respectively. When the power of the input signal exceeds a threshold level of the peaking amplifier transistor 724, the Doherty PA 700 operates in a high-power mode in which the carrier amplifier transistor 704 and the peaking amplifier transistor 724 both supply current to the load 709. At this point, the peaking amplifier transistor 724 provides active load modulation at combining node 708, allowing the current of the carrier amplifier transistor 704 to continue to increase linearly without any appreciable increase in carrier amplifier transistor 704 output voltage, thus maintaining linear operation of the carrier amplifier transistor 704 in class AB mode.

At low power levels, where the power of the input signal at input terminal 701 is lower than the turn-on voltage level of peaking amplifier transistor 724, the Doherty PA 700 operates in a low-power (or back-off) mode in which the carrier amplifier transistor 704 is the only amplifier supplying current to the load 709. Due to the placement of non-linear reactance components 710, 711 in the output network 713, the carrier amplifier transistor 704 is presented with a higher effective load impedance due to the non-linear effect of the non-linear reactance components 710, 711, which extends the range of load modulation to further increase the efficiency of the carrier amplifier when the peaking amplifier is off. In an embodiment, non-linear reactance components 710' and 711' may be placed in the input network 703 of the carrier amplifier path. In another embodiment, non-linear reactance components 710" and 711" may be placed in the output network 725 of the peaking amplifier path. In yet another embodiment, non-linear reactance components 710'" and 711'" may be placed in the input network 723 of the peaking amplifier path.

Figure 8:
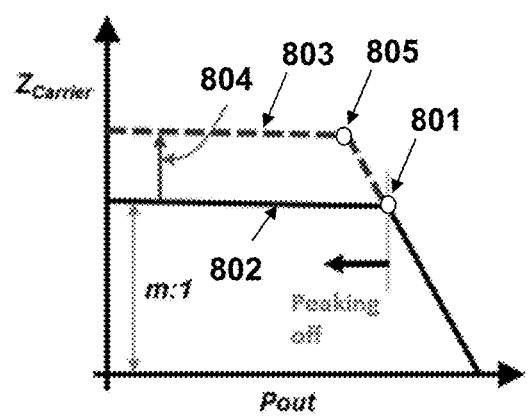
FIG. 8 is a graph illustrating the effect of a modification to the carrier amplifier of a Doherty PA to extend the load modulation of the carrier PA.

FIG. 8 is a graph 800 illustrating the effect of a modification to the carrier amplifier of a Doherty PA to extend the load modulation of the carrier PA. As shown in FIG. 8, when the power level of the signal is below a turn-on point 801 of the peaking amplifier 724, the carrier amplifier 704 would normally have a fixed effective output impedance, which is illustrated by the horizontal section of the solid line 802. The carrier amplifier 704 is presented with a higher effective load impedance due to the non-linear effect of the non-linear reactance components 710, 711, which is depicted by dashed line 803. This range of extended load modulation 804 increases the efficiency of the carrier amplifier 704 when the peaking amplifier 724 is off, and the output power level is at or below point 805.

Figure 9:
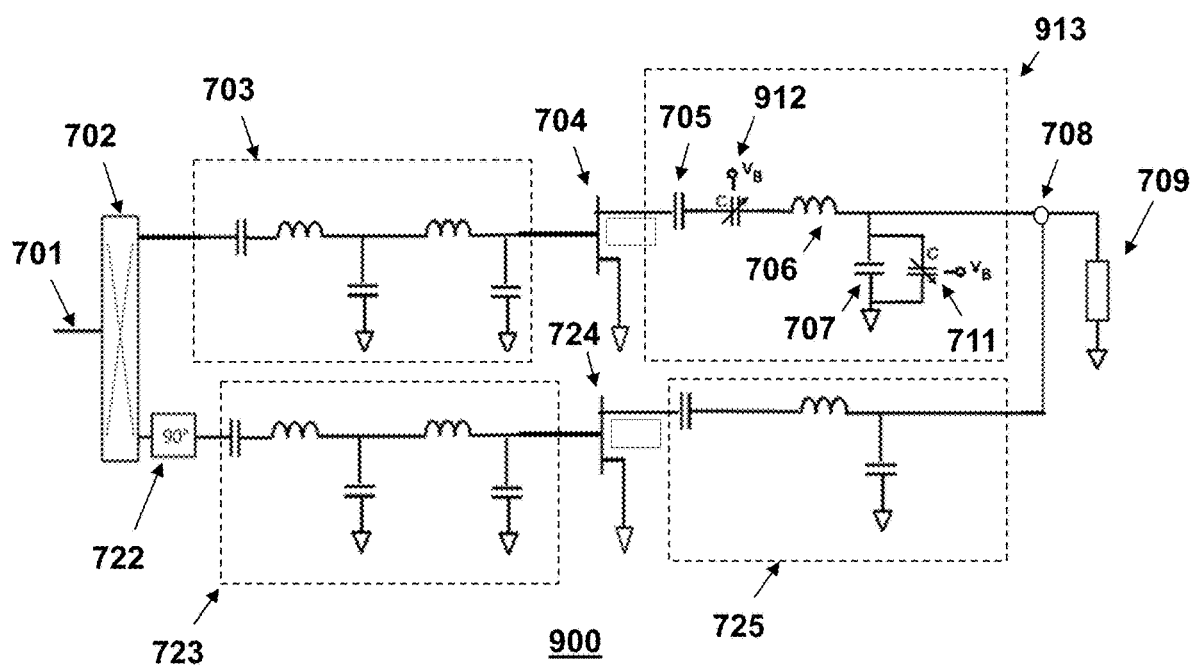
FIG. 9 is a schematic circuit diagram illustrating an embodiment of a series/shunt configuration implemented in the output network of a carrier amplifier of a Doherty PA.

FIG. 9 is a schematic circuit diagram illustrating an embodiment of a series/shunt configuration implemented in a modified output network 913 of a carrier amplifier 704 of a Doherty PA 900. In the embodiment illustrated in FIG. 9, the modified output network 913 comprises the same capacitor-inductor-capacitor (CLC) network of FIG. 7 with, however, a non-linear reactance component 912 placed in series with the series capacitor 705, which is in contrast to the parallel non-linear reactance component 710 illustrated in FIG. 7. Similar to the description provided for FIG. 7, the non-linear reactance components 711 and 912 of the modified output network 913 can be configured with a bias voltage ($V_B$) that is fixed (e.g., 0V). The output voltage level of the carrier amplifier 704 applied to the non-linear reactance components 711 and 912 can cause such components to modulate a load presented to the carrier amplifier 704 based on the non-linear effects of the non-linear reactance components 711 and 912 and the range of signal levels generated by the carrier amplifier 704. It will be appreciated that other or similar configurations of non-linear reactance components can be applied to the input networks 703, 723, and output network 725 of the peaking amplifier 724.

Figure 10:
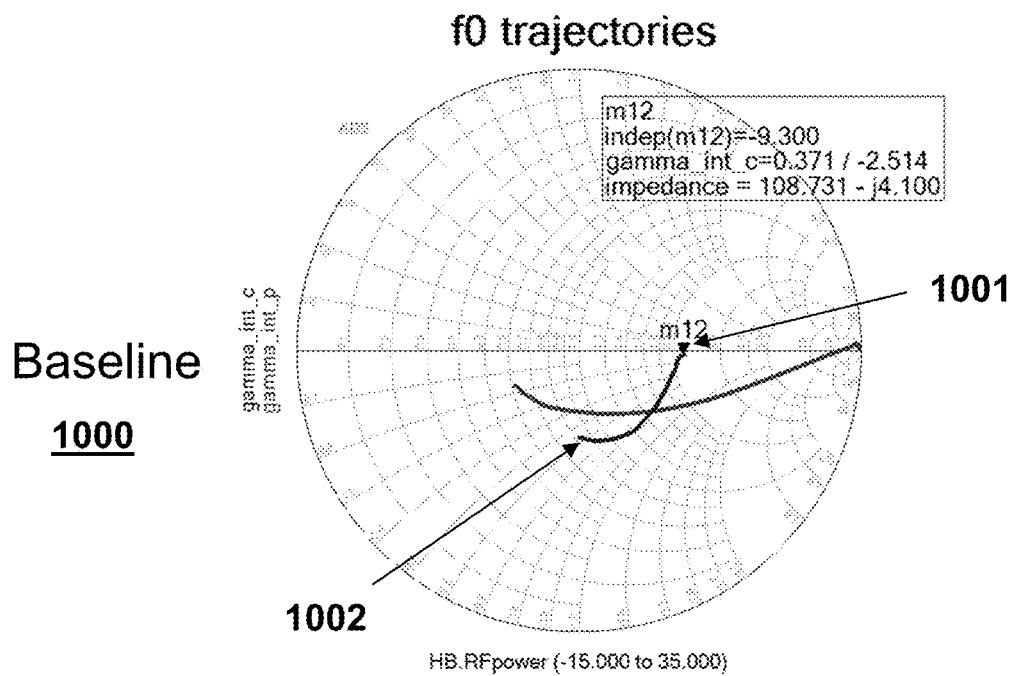
FIG. 10 includes two Smith charts illustrating a change in load lines of a baseline Doherty amplifier and a modified Doherty amplifier.
Figure 10:
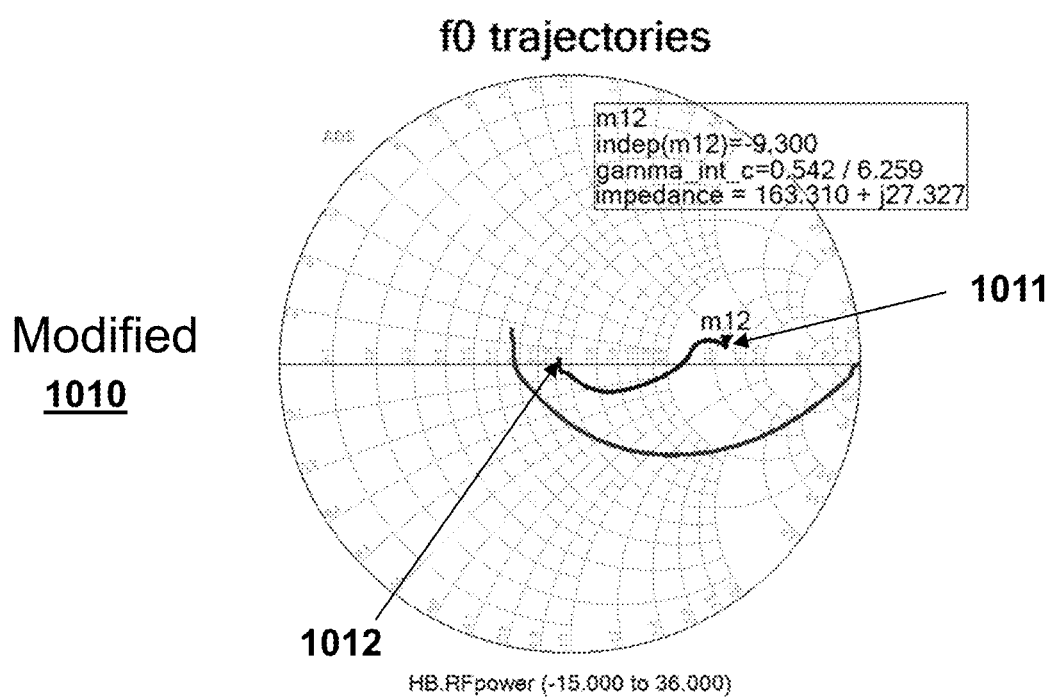

FIG. 10 includes two Smith charts 1000, 1010 illustrating impedance responses of a baseline (conventional) Doherty amplifier that is not configured for load modulation as described in the subject disclosure versus a Doherty amplifier modified to utilize the output network 713 of FIG. 7. FIG. 10 thus depicts a baseline Smith chart 1000 providing the impedance response of a baseline (conventional) Doherty amplifier that does not utilize the dynamic load modulation features described in the subject disclosure (e.g., self-biased non-linear reactance components), while the modified Smith chart 1010 reflects the impedance response of a modified Doherty amplifier configured to use non-linear reactance components 710, 711 as shown in FIG. 7. As illustrated in FIG. 10, the effective impedance seen at an output (drain terminal) of a carrier PA at high power levels is approximately the same, about 40 ohms (see points 1002 and 1012, respectively), for the baseline and the modified Smith charts 1000, 1010. In contrast, the baseline Smith chart 1000 shows that the effective impedance that the carrier PA sees at the output increases to about 108.7 ohms (point 1001) when the carrier PA is operating at lower power levels. For the modified Doherty amplifier as shown in FIG. 7, on the other hand, the effective impedance that the carrier PA sees at the output increases to 163.3 ohms (point 1011) at similarly lower power levels. The higher impedance presented to the carrier PA as depicted by the modified Smith chart 1010 increases the efficiency of the carrier PA at lower power levels, i.e., below the turn-on point of the peaking amplifier.

Figure 11:
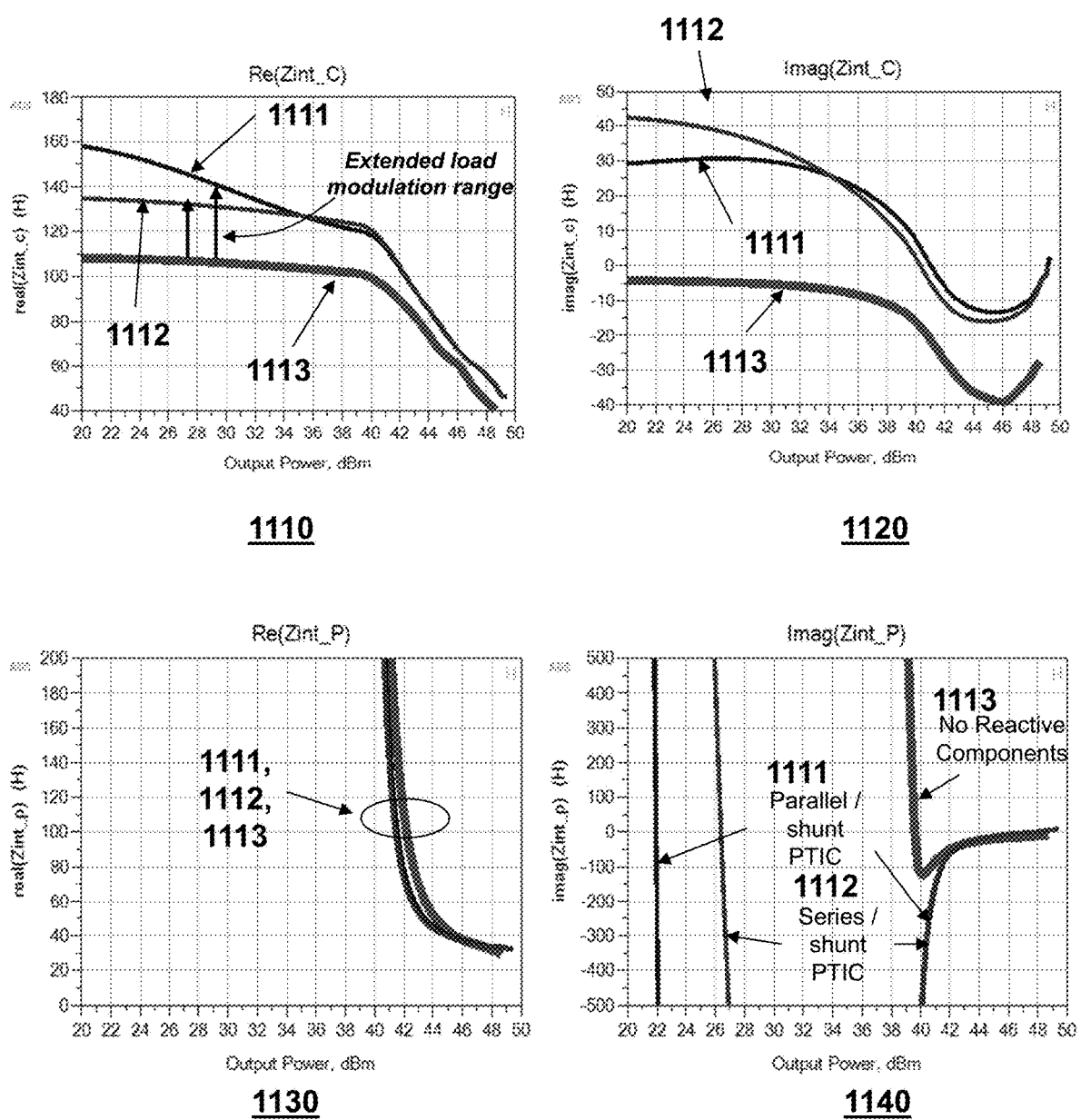
FIG. 11 includes four graphs illustrating the real and imaginary components of the effective load impedance presented to carrier and peaking amplifiers in a Doherty PA.

FIG. 11 includes four graphs 1110-1140 illustrating the real and imaginary components of the effective load impedance presented to the carrier and peaking amplifiers in three configurations: (1) baseline (i.e., unmodified Doherty amplifier) shown as curve 1113, (2) series/shunt (illustrated in FIG. 9) shown as curve 1112, and (3) parallel/shunt (illustrated in FIG. 7) shown as curve 1111. The top two graphs 1110 and 1120 are for the carrier amplifier and illustrates the range of effective real and imaginary impedances, respectively, presented to the carrier amplifier. The top left graph 1110 shows the real component of the effective impedance as a function of power output, which ranges from about 110 ohms on curve 1113 (baseline), about 135 ohms on curve 1112 for the series/shunt configuration, and about 160 ohms on the curve 1111 for the parallel/shunt configuration—these curves illustrate the impedance presented to the carrier amplifier at low power levels while the peaking amplifier is off (i.e., below 40 dBm). Curves 1111 and 1112 merge to about 120 ohms when the peaking amplifier turns on at about 40 dBm. When comparing curves 1111 and 1112 to the baseline curve 1113, it is clear that the modified Doherty amplifiers of FIGS. 7 and 9 present the carrier amplifier a higher impedance than the impedance presented to a carrier amplifier of a baseline Doherty amplifier when the peaking amplifier is off (below 40 dBm). This higher impedance improves the efficiency of the carrier amplifier as noted above.

The top right graph 1120 shows curves for the imaginary component of effective impedance presented to the carrier amplifier for the three configurations, curve 1111 for the parallel/shunt configuration, curve 1112 for the series/shunt configuration, and curve 1113 for the baseline configuration. The curves 1111 and 1112 show a higher imaginary component of effective impedance for the series/shunt and parallel shunt configurations than the baseline configuration (curve 1113). The effect of these higher impedances causes the carrier amplifier to be more power efficient in the series/shunt and the parallel shunt configurations than the baseline configuration. The lower two graphs 1130 and 1140 illustrate the effective impedance presented to the peaking amplifier versus power level for the three configurations. Graphs 1130 and 1140 show that the real and imaginary components of the effective impedance is virtually similar at power levels above the turn on point of the peaking amplifier (40 dBm).

Figure 12:
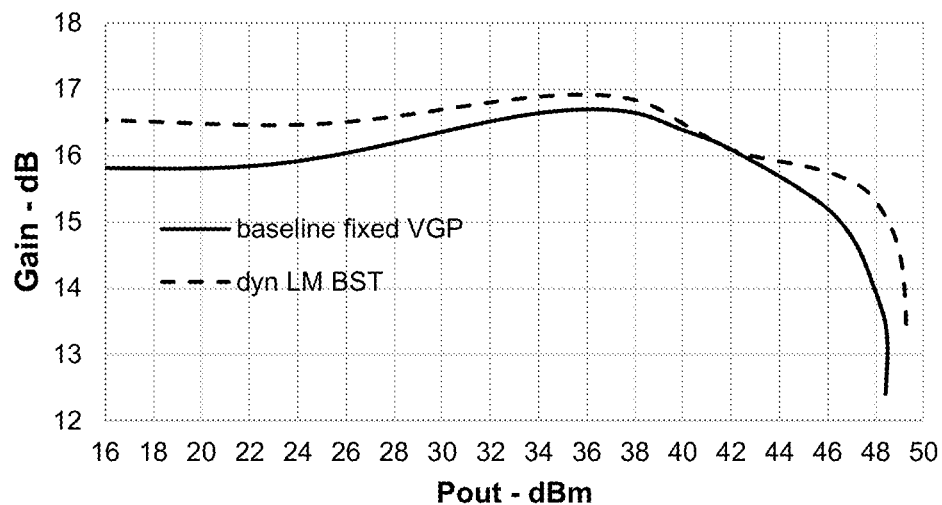
FIG. 12 includes two graphs illustrating gain and drain efficiency as a function of output power of a Doherty PA.
Figure 12:
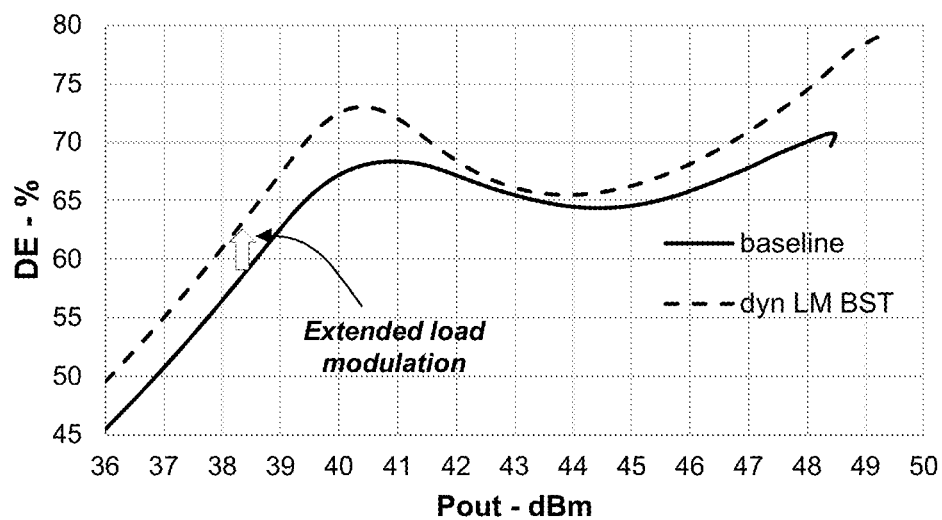

FIG. 12 includes two graphs 1210, 1220 illustrating gain and drain efficiency as a function of output power of a modified versus baseline Doherty PA. The top graph 1210 illustrates the gain (ratio of output power to input power) of a carrier PA with a baseline configuration, represented by the solid line, and a carrier PA with a non-linear reactance component in an output network, represented by the dashed line. The lower graph 1220 illustrates drain efficiency versus power for the two configurations. When comparing the dashed curves to the solid curves of graphs 1210, 1220, it is apparent that the gain and efficiency of the carrier PA of a modified Doherty amplifier (such as shown in FIG. 7) is improved over a baseline Doherty amplifier operating below 40 dBm—the turn off region of the peaking PA.

Figure 13:
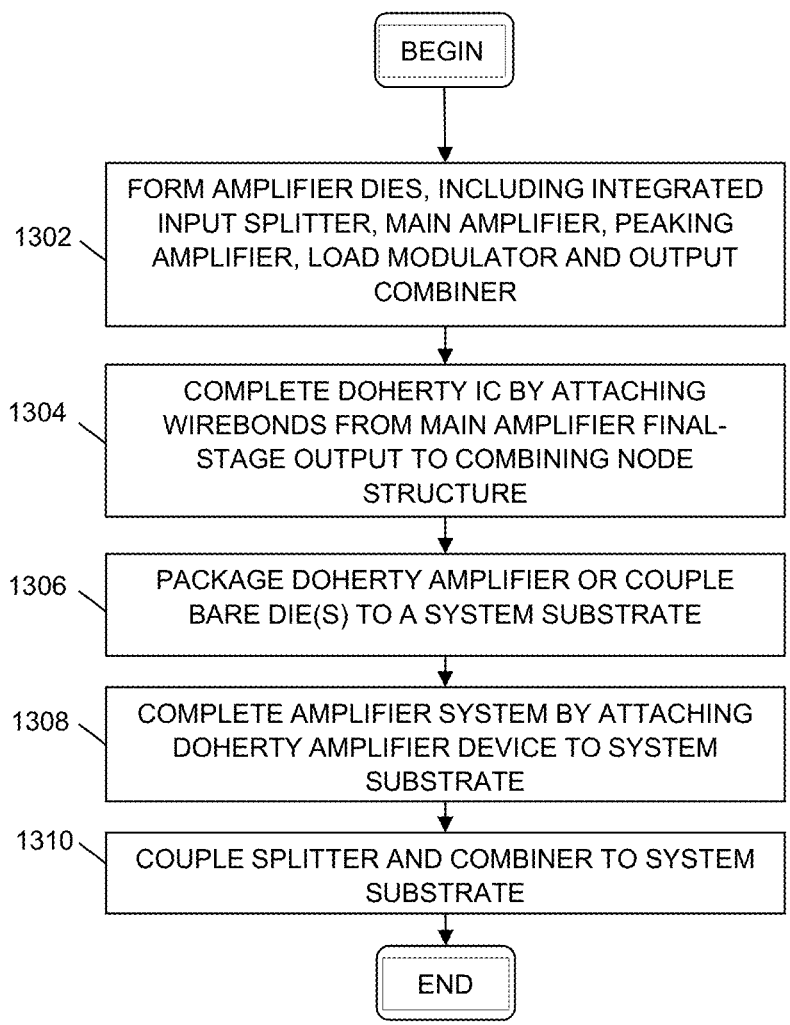
FIG. 13 is a flowchart of a method of making a Doherty power amplifier IC, and a packaged Doherty amplifier device, in accordance with an example embodiment.

FIG. 13 is a flowchart of a method of making a Doherty power amplifier IC, in accordance with an example embodiment. The method 1300 may begin, in block 1302, by forming one or more amplifier dies, which include carrier amplifier transistors and peaking amplifier transistors. The carrier amplifier transistors and peaking amplifier transistors may form portions of a single die or multiple dies. In addition, forming the amplifier die may include integrally forming a splitter, a combining node, matching networks, one or more non-linear reactance components, and/or other integrated components. In alternate embodiments, the transistor die(s), splitter, combining node, matching networks, and/or non-linear reactance component(s) may be separate and distinct devices/circuits that are coupled to a substrate (e.g., a PCB or other substrate) that is distinct from the amplifier die.

In block 1304, the Doherty amplifier IC is completed by connecting the output terminal of the carrier amplifier final-stage transistor to the combining node structure. For example, the connection may be made with wirebonds and an impedance inverter to compensate for a phase delay (e.g., 90 degrees) between the carrier and peaking amplifier outputs. The output phase delay circuit may have a CLC topology. In block 1304, the non-linear reactance component(s) formed in block 1302 can be coupled to the CLC topology in series and/or shunt configurations to provide the main amplifier load modulation as described in previous embodiments.

The Doherty amplifier may then be packaged in block 1306. The Doherty amplifier may be packaged in an overmolded or air-cavity power package. Alternatively, when all components of the Doherty amplifier are integrally formed in a single IC, the Doherty amplifier IC may be attached as a bare die to a system substrate (e.g., a module or PCB substrate). When packaged in an overmolded package, the carrier and peaking amplifier die(s), the matching networks, and the non-linear reactance component(s) may be connected to a PCB or to a conductive flange of a leadframe, wirebonds may be coupled between input, output, and bias leads of the leadframe and appropriate bond pads of the carrier and peaking amplifier die(s), and the flange, leads, matching networks, non-linear reactance components, and die(s) may be encapsulated in molding compound. When packaged in an air-cavity package, an insulator frame may be attached to the top surface of a conductive flange, the carrier and peaking amplifier die(s), the matching networks, and the non-linear reactance component(s) may be connected to the top surface of the flange in the frame opening, input, output, and bias leads may be connected to the top surface of the insulator frame, wirebonds may be coupled between the input, output, and bias leads and appropriate bond pads of the carrier and peaking amplifier die(s), and a cap may be applied over the flange, insulator frame, leads, wirebonds, carrier and peaking amplifier die(s), matching networks, and non-linear reactance component(s) to encase the Doherty amplifier components in an air cavity.

In block 1308, the amplifier system may be completed by attaching the Doherty amplifier device (or in some embodiments the bare die) to a system substrate, such as a PCB. More specifically, the bottom surface of the Doherty amplifier device may be connected to a conductive coin to provide a ground reference and heat sink to the device, and the device's input, output, and bias leads may be connected to corresponding conductive paths of the system substrate.

According to an embodiment, additional components may be coupled to the system substrate, in block 1310, to complete the amplifier system. For example, the splitter and combiner may be coupled to the system substrate. In addition, in some embodiments, portions of the input and/or output matching networks and the non-linear reactance component(s) may be implemented externally to the packaged Doherty amplifier device, and instead implemented on the system substrate. In addition, a metallic cover or shield connected to a ground plane of the PCB can be used to cover in whole or in part the components of the PCB to provide electrical isolation from other devices of other systems. The method may then end.

Figure 14:
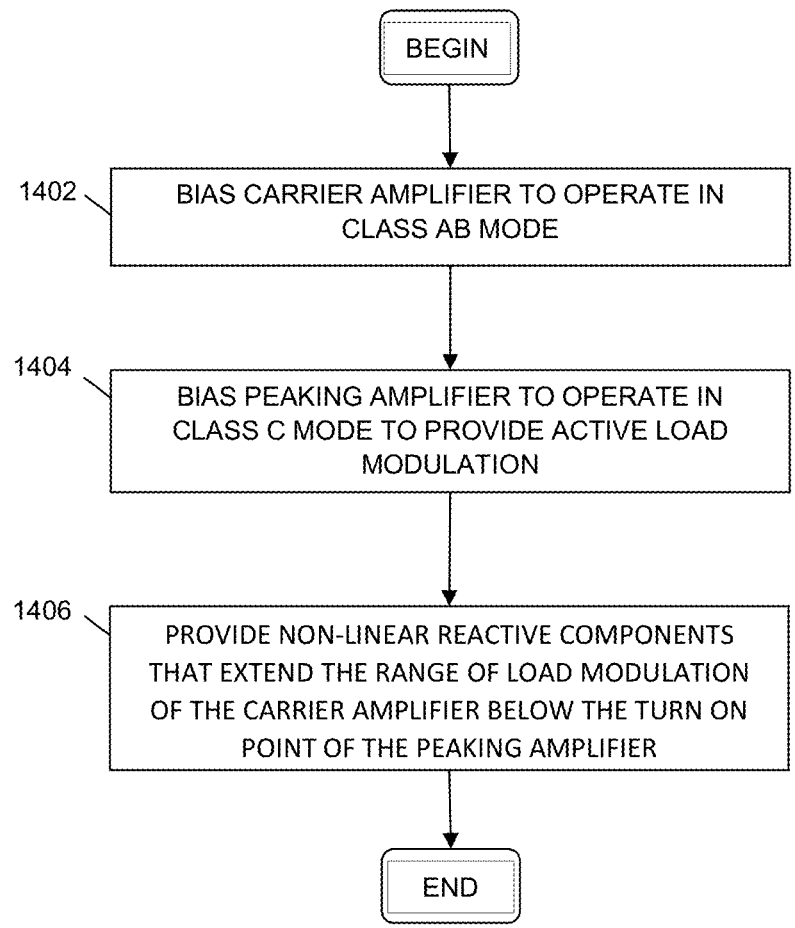
FIG. 14 is a method of operating a Doherty power amplifier, in accordance with an example embodiment.

FIG. 14 is a method of operating a Doherty power amplifier, in accordance with an example embodiment. The method 1400 may begin, in block 1402, by setting the operating point of the carrier amplifier. In an embodiment, the carrier amplifier is biased to operate in class AB mode.

In block 1404, the peaking amplifier operating point is set. The peaking amplifier typically is biased to operate in class C mode. When the power of the input signal exceeds a threshold level of the peaking amplifier, the Doherty PA operates in a high-power mode in which the carrier amplifier and the peaking amplifier both supply current to the load. At this threshold level, the peaking amplifier provides active load modulation, allowing the current of the carrier amplifier to continue to increase linearly without any appreciable increase in carrier amplifier output voltage, thus maintaining linear operation of the carrier amplifier in class AB mode.

In block 1406, non-linear reactance component(s) are provided in the output network of the carrier amplifier, which are set to a fixed bias voltage (e.g., 0 volts). At low power levels below the threshold level of operation of the peaking amplifier, only the carrier amplifier supplies current to the load. Due to the self-biased dynamic modulation provided by the non-linear reactance components in the output network (as shown in FIG. 7 or 9), the carrier amplifier is presented with a higher effective load impedance, which extends the range of load modulation to further increase the efficiency of the carrier amplifier when the peaking amplifier is off. The method may then end.

It will be appreciated that an amplifier having a non-linear reactance component as described above configured with a fixed bias voltage so as to cause the non-linear reactance component to operate within a portion of a desired non-linear impedance profile of the non-linear reactance component, can be utilized to modulate an impedance presented at an input terminal, output terminal, or both of an amplifier, based on a signal amplitude or power at the input and/or output terminals of the amplifier. For example, in the case of a Doherty amplifier device, the non-linear reactance component can be coupled to or combined with the input and/or output networks of a main amplifier and/or the peaking amplifier. Similarly, the non-linear reactance component can be coupled to the combiner to perform load modulation closer to a load. Accordingly, such variants in embodiments in the use of a non-linear reactance component are contemplated with any amplifier architecture. Further, it will be appreciated that the fixed bias voltage applied to the non-linear reactance component does not necessarily have to be set to ground. It can be set to any voltage level (above or below ground) configured to cause the non-linear reactance component to operate within a portion of the desired non-linear impedance profile of the non-linear reactance component.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

For example, in an embodiment, a non-linear C-V element may be placed at an input to PA for controlling dynamically input impedance. Likewise, the non-linear C-V element may be placed at a matching network after the Doherty PA combiner for dynamically controlling output impedance.

What is claimed is:

1. An amplifier system, comprising:
a power amplifier having an input terminal and an output terminal;
an output network coupled to the output terminal of the power amplifier; and
a first non-linear reactance component coupled to the output network, wherein a change in an output voltage signal generated by the power amplifier causes the first non-linear reactance component to change a first effective impedance of a load presented to the power amplifier via the output network, wherein the first non-linear reactance component is configured to utilize a fixed bias voltage, which is not a ground reference, that serves as an operating reference point of the first non-linear reactance component, wherein the first non-linear reactance component comprises a plurality of reactance elements arranged in series, and wherein a number of the plurality of reactance elements is selected to produce a non-linear impedance profile that operates within a range of the output voltage signal generated by the power amplifier and the operating reference point of the first non-linear reactance component.

2. The amplifier system of claim 1, wherein the power amplifier is operated in class A, class B, class AB or class C mode.

3. The amplifier system of claim 2, wherein the power amplifier amplifies radio frequency signals presented by an input network.

4. The amplifier system of claim 3, wherein the input network includes a second non-linear reactance component, and wherein the second non-linear reactance component modulates a second effective impedance of the input network presented at the input terminal of the power amplifier.

5. The amplifier system of claim 1, wherein the power amplifier is a peaking amplifier in a Doherty amplifier configuration.

6. The amplifier system of claim 1, wherein the power amplifier is a carrier amplifier in a Doherty amplifier configuration.

7. The amplifier system of claim 6, wherein modulation increases the first effective impedance of the load at operating power levels below a turn-on voltage of a peaking amplifier, thereby improving a power efficiency of the carrier amplifier at low power levels.

8. The amplifier system of claim 7, wherein a first reactance element of the plurality of reactance elements is in a series configuration in the output network, and a second reactance element of the plurality of reactance elements is in a shunt configuration in the output network.

9. The amplifier system of claim 8, wherein the plurality of reactance elements includes a varactor diode, a metal-oxide semiconductor (MOS) capacitor, a variable plate micro-electro-mechanical system (MEMS) capacitor, a passive tunable integrated circuit (PTIC), or a combination thereof.

10. The amplifier system of claim 1, wherein the plurality of reactance elements is configured in series.

11. The amplifier system of claim 10, wherein the plurality of reactance elements comprises four or fewer reactance elements.

12. The amplifier system of claim 1, wherein the fixed bias voltage of the first non-linear reactance component is a non-zero voltage or a self-bias voltage of 0 V DC.

13. The amplifier system of claim 1, wherein each reactance element of the plurality of reactance elements is fabricated from barium strontium titanate.

14. A Doherty amplifier, comprising:
a carrier amplifier coupled to a first output network, wherein the first output network includes a non-linear reactance component configured to utilize a fixed bias voltage that serves as an operating reference point of the non-linear reactance component; and
a peaking amplifier coupled to a second output network, wherein the first output network is coupled to the second output network resulting in a combined network configurable for coupling to a load,
wherein a change in an output voltage signal generated by the carrier amplifier causes the non-linear reactance component to change an effective impedance of the load presented to the carrier amplifier via the combined network,
wherein the non-linear reactance component comprises a plurality of reactance elements arranged in series, and
wherein a number of the plurality of reactance elements is selected to produce a non-linear impedance profile that operates within a range of the output voltage signal generated by the carrier amplifier and the operating reference point of the non-linear reactance component.

15. The Doherty amplifier of claim 14, wherein the non-linear reactance component comprises a varactor diode, a metal-oxide semiconductor (MOS) capacitor, a variable plate micro-electro-mechanical system (MEMS) capacitor, a passive tunable integrated circuit (PTIC), or a combination thereof.

16. The Doherty amplifier of claim 14, wherein the plurality of reactance elements is configured in series with four or fewer reactance elements.

17. The Doherty amplifier of claim 14, wherein the fixed bias voltage is configured to cause the non-linear reactance component to operate within a portion of the non-linear impedance profile.

18. The Doherty amplifier of claim 17, wherein each reactance element of the plurality of reactance elements is fabricated from barium strontium titanate.

19. A method, comprising:
applying a first bias voltage to a carrier amplifier of a Doherty power amplifier to operate the carrier amplifier in a first mode;
applying a second bias voltage to a peaking amplifier of the Doherty power amplifier to operate the peaking amplifier in a second mode, thereby improving active load modulation of the carrier amplifier at a first input power level greater than a turn-on point of the peaking amplifier; and
applying a third fixed bias voltage to a non-linear reactance component coupled to the carrier amplifier, the peaking amplifier, or both,
wherein the third fixed bias voltage serves as an operating reference point of the non-linear reactance component,
wherein a number of a plurality of reactance elements of the non-linear reactance component is selected to produce a non-linear impedance profile that operates within an operating range of the Doherty power amplifier and the operating reference point of the non-linear reactance component, and
wherein the non-linear reactance component extends a range of load modulation of the Doherty power amplifier.

20. The method of claim 19, wherein the first mode is a class AB mode, wherein the second mode is a class C mode, and wherein the plurality of reactance elements comprise a varactor diode, a metal-oxide semiconductor (MOS) capacitor, a variable plate micro-electro-mechanical system (MEMS) capacitor, a passive tunable integrated circuit (PTIC), or a combination thereof.

* * * * *